(12) United States Patent
Akimoto

(10) Patent No.: US 6,476,788 B1
(45) Date of Patent: Nov. 5, 2002

(54) IMAGE DISPLAY DEVICE AND METHOD OF MAKING THE SAME

(75) Inventor: Hajime Akimoto, Oume (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/351,599

(22) Filed: Jul. 12, 1999

(30) Foreign Application Priority Data

Jul. 22, 1998 (JP) ............................................ 10-206080

(51) Int. Cl.[7] ............................. G09G 3/36; G02F 1/136
(52) U.S. Cl. ............................ 345/92; 345/98; 345/100; 349/42; 349/43; 349/45; 349/47
(58) Field of Search ............................... 345/87, 90, 92, 345/98, 100; 349/41, 42, 43, 45, 47, 52

(56) References Cited

U.S. PATENT DOCUMENTS

| | | | | |
|---|---|---|---|---|
| 5,270,567 A | * | 12/1993 | Mori at al. | 257/412 |
| 5,757,445 A | * | 5/1998 | Vu et al. | 349/158 |
| 5,798,744 A | * | 8/1998 | Tanaka et al. | 347/21 |
| 5,851,440 A | * | 12/1998 | Tanaka et al. | 257/347 |
| 5,926,702 A | * | 7/1999 | Kwon et al. | 349/106 |
| 6,011,277 A | * | 1/2000 | Yamazaki | 257/57 |
| 6,211,553 B1 | * | 4/2001 | Sung | 257/336 |

OTHER PUBLICATIONS

SID (Society for Information Display International Symposium) 94 Digest of Technical Paper, pp. 87–90. (1994).

* cited by examiner

Primary Examiner—Richard Hjerpe
Assistant Examiner—Duc Q Dinh
(74) Attorney, Agent, or Firm—Kenyon & Kenyon

(57) ABSTRACT

Each pixel of an image display device has pixel switch that is a poly-Si TFT of a first type structure, a pixel electrode for applying an electric field to an electro-optical material, gate lines connected to the pixel switches, signal lines connected to the pixel electrodes via the pixel switches, and a display signal voltage applying circuit containing a poly-Si TFT of a second type structure for applying display signal voltages to the signal lines. Gates of the first type TFTs, connected to the gate lines, oppose a first side of a first poly-Si thin film for forming a channel of these TFTs, with a first gate insulating film interposed therebetween. Gates of the second type TFTs oppose a first side of a second poly-Si thin film for forming a channel of these TFTs, with a second gate insulating film interposed therebetween. Sources and drains of the TFTs of the first and second type structures are disposed approximately in one plane on a substrate of the image display device, and the first side of the first poly-Si thin film and the first side of the second poly-Si thin film are on opposite sides of the one plane.

15 Claims, 5 Drawing Sheets

IMAGE DISPLAY DEVICE AND METHOD OF MAKING THE SAME

BACKGROUND OF THE INVENTION

The present invention relates to an image display device and a method of making the same, and particularly to an image display device suitable for increasing the number of pixels and a method of making the same.

A prior art image display device will be explained hereunder with reference to FIGS. 6 and 7.

FIG. 7 illustrates a structure of a prior art poly-Si TFT (thin film transistor) liquid crystal display device. There are a pixel area 120, a signal line shift register 121, a signal line selection switch 122, a gate line shift register 124 and a gate line drive buffer 125 formed on a substrate 109.

A plurality of pixels each comprising a poly-Si TFT 128, a pixel electrode 50 connected thereto and a pixel capacitance 129 formed by the pixel electrode 50 are arranged in a matrix in the pixel area 120, and a gate and a drain of each poly-Si TFT 128 are connected to a gate line 127 and a signal line 126, respectively. For simplicity, only one pixel is shown in FIG. 7.

One end of the gate line 127 is connected to the gate line drive buffer 125 which in turn is scanned by the gate line shift register 124. One end of the signal line 126 is connected to the signal line selection switch 122 which in turn is scanned by the signal line shift register 121. The signal line selection switch 122 is supplied with signals via an analog signal input line 123.

The following explains the operation of the prior art liquid crystal device. The gate line shift register 124 selects the gate lines 127 sequentially via the gate line drive buffer 125. Poly-Si TFTs 128 in pixels in a row corresponding to a selected one of the gate lines 127 are turned on. During this ON period, the signal line shift register 121 scans the signal line selection switch 122 sequentially. The signal line selection switch 122 connects the signal lines 126 to the analog signal input line 123 sequentially when the signal line selection switch 122 is scanned, and consequently display signals inputted to the analog signal input line 123 are written into the respective pixel capacitances 129 sequentially via the signal lines 126 and the poly-Si TFTs 128.

FIG. 6 illustrates a cross-sectional view of a poly-Si TFT 128 disposed in each pixel and also a cross-sectional view of one of poly-Si TFTs constituting the gate line shift register 124 or the signal line shift register 121 disposed around the pixel area 120 on the substrate 109 on which the poly-Si TFTs 128 are formed.

Here, for the sake of simplicity, I shall assume an n-channel TFT. The poly-Si TFT 128 disposed in each pixel comprises a gate 101, a channel region 150 formed of a poly-Si thin film, an n$^+$ source region 102, an n$^-$ source region 103, an n$^+$ drain region 105, and an n$^-$ drain region 104. The poly-Si TFT constituting the gate line shift register 124 or the signal line shift register 121 comprises a gate 106, a channel region 151 formed of a poly-Si thin film, an n$^-$ source region 107 and an n$^+$ drain region 108. Both the above-explained two poly-Si TFTs are identical in structure and fabrication process except for dimensions. The only exception is such that the poly-Si TFT 128 is provided with the n$^-$ source region 103 and the n$^-$ drain region 104 to reduce leakage current through the poly-Si TFT 128 serving as a pixel switch when it is off. In FIG. 6, reference numeral 109 denotes a quartz glass substrate, 110 is a gate insulating film, and 111 is a protective film.

The prior art as explained above is disclosed in detail in SID (Society for Information Display International Symposium) 94 Digest of Technical Papers, pp.87–90 (1994), for example.

As the number of pixels in the display device is increased, the operating speeds of peripheral circuits such as the gate line shift register 124 and the signal line shift register 121, are required to increase further.

But, with the prior art technique, there is a problem in that it is difficult to optimize the designs of the peripheral circuits and the pixel area independently of each other. If the gate insulating film is made thinner for the purpose of speed-up of the peripheral circuits, for example, the poly-Si TFT 128 in the pixel area becomes incapable of withstanding a high voltage required for driving the liquid crystal.

SUMMARY OF THE INVENTION

To solve the above problems, an image display device according to an embodiment of the present invention comprises a plurality of pixels arranged in a matrix, the plurality of pixels each being provided with a pixel switching means, a pixel electrode coupled with the pixel switching means for applying an electric field to a material producing an electro-optical effect; a common electrode for cooperating with the pixel electrode in driving the material producing an electro-optical effect; a plurality of gate lines each extending in parallel with each other and connected to a corresponding row of the pixel switching means for selecting the corresponding row of the pixel switching means in a predetermined order; a gate line driver circuit for driving the plurality of gate lines; a plurality of signal lines extending in such a manner as to intersect the plurality of gate lines for supplying display signal voltages to the pixel electrodes via selected ones of the pixel switching means; and a display signal voltage applying circuit for applying the display signal voltages to respective ones of the plurality of signal lines, wherein the pixel switching means each is comprised of a poly-Si TFT of a first type structure, the display signal voltage applying circuit contains a plurality of poly-Si TFTs of a second type structure, a gate of each of the poly-Si TFTs of the first type structure is disposed to oppose a first side of a first poly-Si thin film for forming a channel of the poly-Si TFT of the first type structure with a first gate insulating film interposed therebetween and is connected to a corresponding one of the plurality of gate lines, a gate of each of the plurality of poly-Si TFTs of the second type structure is disposed to oppose a first side of a second poly-Si thin film for forming a channel of each of the plurality of poly-Si TFTs of the second type structure with a second gate insulating film interposed therebetween, sources and drains of the poly-Si TFTs of the first and second type structures are disposed approximately in a same plane on a same substrate of the image display device, and the first side of the first poly-Si thin film and the first side of the second poly-Si thin film are on opposite sides of the same plane from each other.

To solve the above problems, an image display device according to another embodiment of the present invention comprises a plurality of pixels arranged in a matrix, the plurality of pixels each being provided with a pixel switching means, a pixel electrode coupled with the pixel switching means for applying an electric field to a material producing an electro-optical effect; a common electrode for cooperating with the pixel electrode in driving the material producing an electro-optical effect; a plurality of gate lines each extending in parallel with each other and connected to a corresponding row of the pixel switching means for selecting the corresponding row of the pixel switching means in a predetermined order; a gate line driver circuit for driving the plurality of gate lines; a plurality of signal lines extending in such a manner as to intersect the plurality of gate lines for supplying display signal voltages to the pixel electrodes via selected ones of the pixel switching means; and a display signal voltage applying circuit for applying the display signal voltages to respective ones of the plurality of signal lines, wherein the pixel switching means each is comprised of a poly-Si TFT of a first type structure, the display signal voltage applying circuit contains a plurality of poly-Si TFTs of a second type structure, a gate of each of the poly-Si TFTs of the first type structure is disposed to oppose a first side of a first poly-Si thin film for forming a channel of the poly-Si TFT of the first type structure with a first gate insulating film interposed therebetween and is connected to a corresponding one of the plurality of gate lines, a gate of each of the plurality of poly-Si TFTs of the second type structure is disposed to oppose a first side of a second poly-Si thin film for forming a channel of each of the plurality of poly-Si TFTs of the second type structure with a second gate insulating film interposed therebetween, sources and drains of the poly-Si TFTs of the first and second type structures are disposed approximately in a same plane on a same substrate of the image display device, the first side of the first poly-Si thin film and the first side of the second poly-Si thin film are on opposite sides of the same plane from each other, and the second gate insulating film is thinner than the first gate insulating film.

To solve the above problems, an image display device according to still another embodiment of the present invention comprises a plurality of pixels arranged in a matrix, the plurality of pixels each being provided with a pixel switching means, a pixel electrode coupled with the pixel switching means for applying an electric field to a material producing an electro-optical effect; a common electrode for cooperating with the pixel electrode in driving the material producing an electro-optical effect; a plurality of gate lines each extending in parallel with each other and connected to a corresponding row of the pixel switching means for selecting the corresponding row of the pixel switching means in a predetermined order; a gate line driver circuit for driving the plurality of gate lines; a plurality of signal lines extending in such a manner as to intersect the plurality of gate lines for supplying display signal voltages to the pixel electrodes via selected ones of the pixel switching means; and a display signal voltage applying circuit for applying the display signal voltages to respective ones of the plurality of signal lines, wherein the pixel switching means each is comprised of a poly-Si TFT of a first type structure, the display signal voltage applying circuit contains a plurality of poly-Si TFTs of a second type structure, a first gate of each of the poly-Si TFTs of the first type structure is disposed to oppose a first poly-Si thin film for forming a channel of the poly-Si TFT of the first type structure with a first gate insulating film interposed therebetween on a surface of a substrate of the image display device and is connected to a corresponding one of the plurality of gate lines, a second gate of each of the plurality of poly-Si TFTs of the second type structure is disposed to oppose a second poly-Si thin film for forming a channel of each of the plurality of poly-Si TFTs of the second type structure with a second gate insulating film interposed therebetween on the surface, an order of arrangement of the first gate and the first poly-Si thin film is reversed from an order of arrangement of the second gate and second poly-Si thin film, and the second gate insulating film is thinner than the first gate insulating film.

To solve the above problems, a method of making an image display device according to still another embodiment of the present invention comprises a plurality of pixels arranged in a matrix, the plurality of pixels each being provided with a pixel switching means, a pixel electrode coupled with the pixel switching means for applying an electric field to a material producing an electro-optical effect; a common electrode for cooperating with the pixel electrode in driving the material producing an electro-optical effect; a plurality of gate lines each extending in parallel with each other and connected to a corresponding row of the pixel switching means for selecting the corresponding row of the pixel switching means in a predetermined order; a gate line driver circuit for driving the plurality of gate lines; a plurality of signal lines extending in such a manner as to intersect the plurality of gatelines for supplying display signal voltages to the pixel electrodes via selected ones of the pixel switching means; and a display signal voltage applying circuit for applying the display signal voltages to respective ones of the plurality of signal lines, wherein the pixel switching means each is comprised of a poly-Si TFT of a first type structure, the display signal voltage applying circuit contains a plurality of poly-Si TFTs of a second type structure, a first gate of each of the poly-Si TFTs of the first type structure is disposed to oppose a first poly-Si thin film for forming a channel of the poly-Si TFT of the first type structure with a first gate insulating film interposed therebetween on a surface of a substrate of the image display device and is connected to a corresponding one of the plurality of gate lines, a second gate of each of the plurality of poly-Si TFTs of the second type structure is disposed to oppose a second poly-Si thin film for forming a channel of each of the plurality of poly-Si TFTs of the second type structure with a second gate insulating film interposed therebetween on the surface of the substrate, an order of arrangement of the first gate and the first poly-Si thin film is reversed from an order of arrangement of the second gate and second poly-Si thin film; the method including the steps of forming a thin film made mainly, of amorphous Si on the surface of the substrate after one of two steps of (a) forming the first gate and the gate insulating film and (b) forming the second gate and the second gate insulating film, and converting the amorphous Si into polycrystalline silicon.

BRIEF DESCRIPTION OF THE DRAWINGS

In the accompanying drawings, in which like reference numerals designate similar components throughout the figures, and in which.

DETAILED DESCRIPTION OF THE PREFERRED EMBODIMENTS

First Embodiment

A first embodiment of the present invention will be explained by reference to FIGS. 1 to 3C.

Figure 2:
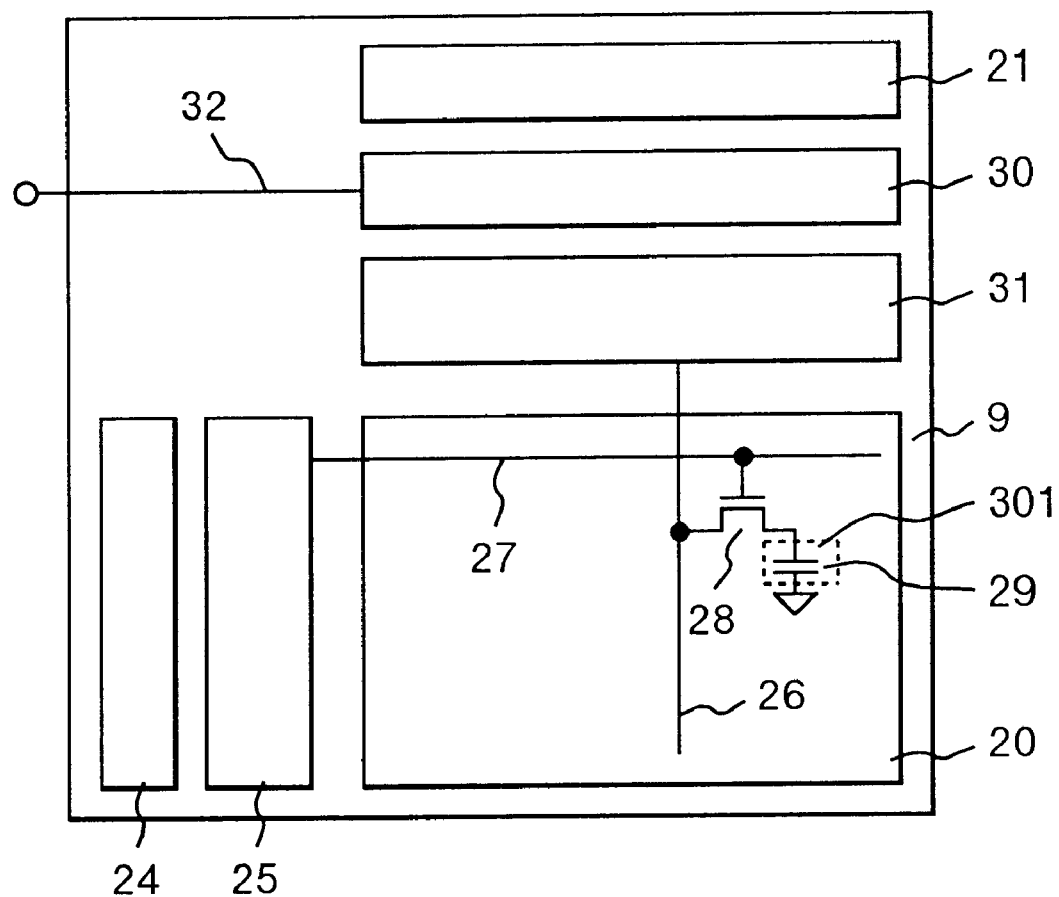
FIG. 2 is an illustration of a structure of the first embodiment of an image display device in accordance with the present invention.

FIG. 2 illustrates a structure of a poly-Si TFT liquid crystal display device of an embodiment in accordance with the present invention. There are a pixel area 20, a latch-circuit shift register 21, a latch circuit 30, a digital-to-analog converter 31, a shift register 24 and a gate line drive buffer 25 formed on a substrate 9.

A plurality of pixels each comprising a poly-Si TFT 28, a pixel electrode 301 connected thereto and a pixel capacitance 29 formed by the pixel electrode 301 are arranged in a matrix in the pixel area 20, and a gate and a drain of each poly-Si TFT 28 are connected to a gate line 27 and a signal line 26, respectively. For simplicity, only one pixel is shown in FIG. 2.

One end of the gate line 27 is connected to the gate line drive buffer 25 which in turn is scanned by the gate line shift register 24. One end of the signal line 26 is connected to the digital-to-analog converter 31 to which the latch circuit 30 inputs signals. The latch circuit 30 is scanned by the latch-circuit shift register 21. The latch circuit 30 is supplied with signals via a digital signal input line 32.

The following explains the operation of the first embodiment. The gate line shift register 24 selects the gate lines 27 sequentially via the gate line drive buffer 25. Poly-Si TFTS 28 in pixels in a row corresponding to a selected one of the gate lines 27 are turned on. The latch-circuit shift register 21 scans the latch circuit 30 sequentially and the latch circuit 30 stores input signals from the digital signal input line 32 sequentially as it is scanned. The latch circuit 30 supplies the inputted signals to the digital-to-analog converter 31 with a horizontal scanning period, and the digital-to-analog converter 31 outputs the analog signals to the signal lines 26 during the horizontal scanning period. Therefore the video signals supplied to the digital signal input line 32 are written in an analog voltage form into the respective pixel capacitances 29 sequentially via the latch circuit 30, the digital-to-analog converter 31, the respective signal lines 26 and the respective poly-Si TFTs 28.

Figure 1:
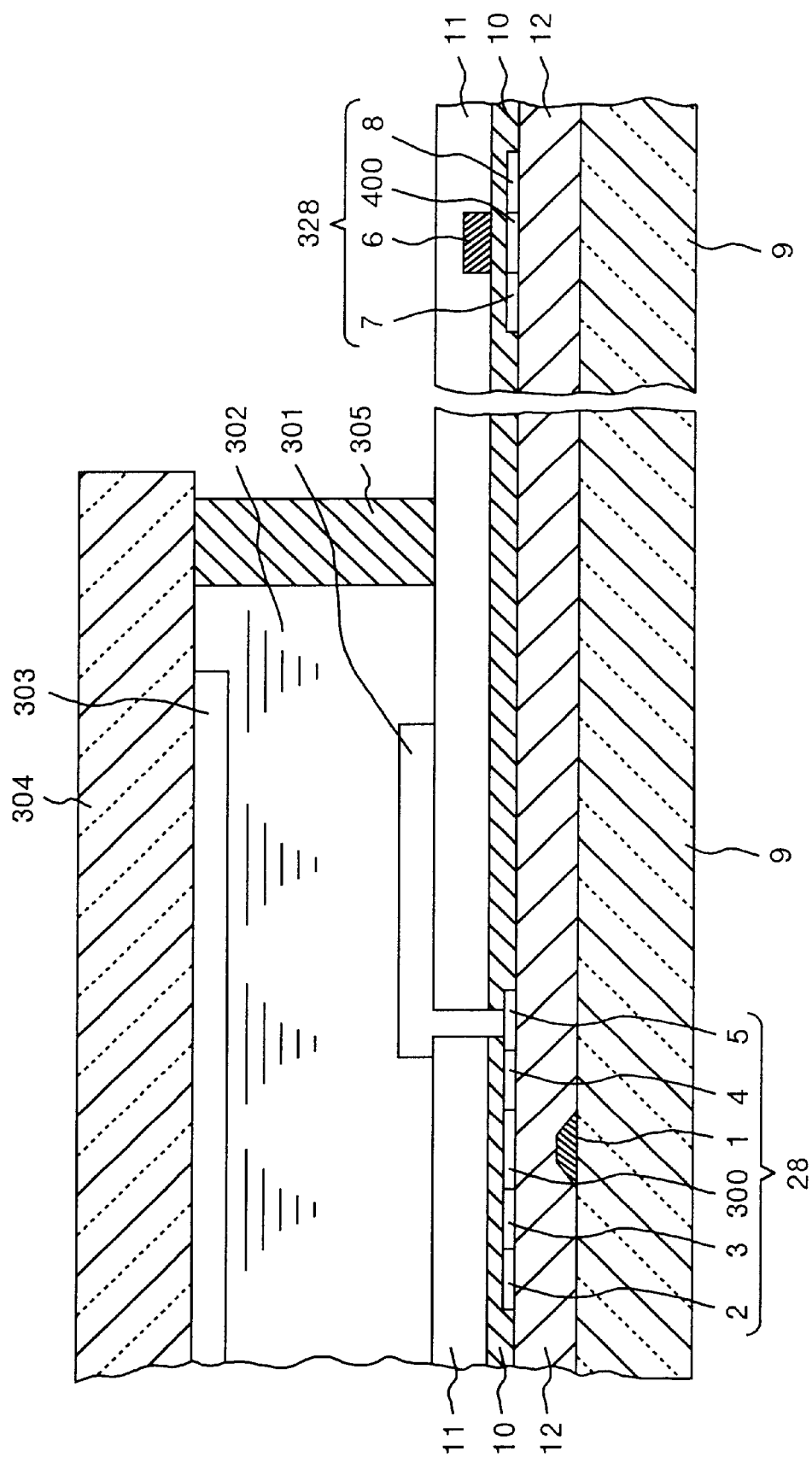
FIG. 1 is a cross-sectional view of a first embodiment of an image display device in accordance with the present invention.

FIG. 1 illustrates a cross-sectional view of an example of a poly-Si TFT 28 representing both the high-voltage poly-Si TFT 28 provided in each pixel and a high-voltage poly-Si TFT constituting the gate line drive buffer 25, and a cross-sectional view of a poly-Si TFT 328 as an example of high-performance poly-Si TFTs constituting the digital-to-analog converter 31, the latch circuit 30, the latch-circuit shift register 21 and the gate line shift register 24.

Here, for the sake of simplicity, I shall assume n-channel TFTS. The following explanation is applicable to the case where p-channel TFTs are used, except that the poly-Si TFTs 28 and the poly-Si TFTs 328 are of the n-channel type. The poly-Si TFT 28 disposed in each pixel and a high-voltage poly-Si TFT constituting the gate line drive buffer 25 comprise a gate 1, a channel region 300 formed of a poly-Si thin film, an $n^+$ source region 2, an $n^-$ source, region 3, an $n^+$ drain region 5 and an $n^-$ drain region 4 formed on a substrate 9, as in the case of the poly-Si TFT 28 disposed in each pixel illustrated in FIG. 1.

A pixel electrode 301 is connected to the $n^+$ drain region 5 of the poly-Si TFT 28 in each pixel and a common electrode 303 is disposed to oppose the pixel electrode 301 with a liquid crystal layer 302 interposed therebetween. Reference numeral 304 denotes a glass substrate for supporting the common electrode 303, reference numeral 305 denotes an adhesive for sealing the substrate 9 and the substrate 304 together with the liquid crystal layer 302 sandwiched therebetween.

The poly-Si TFT 328 is an example of the high-performance poly-Si TFTs constituting the digital-to-analog converter 31, the latch circuit 30, the latch-circuit shift register 21 and the gate line shift register 24, and comprises a gate 6, a channel region 400 formed of a poly-Si thin film, an $n^+$ source region 7 and an $n^+$ drain region 8 disposed on the substrate 9 on which the poly-Si TFTs 28 are formed.

The poly-Si thin film forming the channel region in the high-voltage poly-Si TFT 28 is identical in structure to that in the high-performance poly-Si TFT 328, except for dimensions, but the structure of this embodiment is such that the gate 1 and the first gate insulating film 12 of the high-voltage poly-Si TFT 28 are capable of being optimized independently of the gate 6 and the second gate insulating film 10 of the high-performance poly-Si TFT 328, respectively.

That is to say, the thickness of the second gate insulating film 10 (30 to 50 nm, for example) is made thinner for realizing the high-speed operation of the high-performance poly-Si TFT 328 than the thickness of the first gate insulating film 12 (about 100 nm, for example) of the high-voltage poly-Si TFT 28.

In FIG. 1, the substrate 9 may be made of glass or quartz, the first and second gate insulating films 12, 10 may be formed of $SiO_2$, for example, and the protective film 11 may be formed of $SiO_2$, $Si_3N_4$ or the like. Alignment films for aligning liquid crystal molecules are usually formed on the pixel electrodes 301 and the common electrode 303 of the liquid crystal display device are omitted from FIG. 1.

FIG. 1 illustrates a twisted nematic type liquid crystal display device in which the common electrode 303 is disposed on the substrate 304 opposing the substrate 9 so as to oppose the pixel electrode 301 disposed on the substrate 9, but the present invention is not limited to this type of liquid crystal display devices. The present invention is also applicable to a liquid crystal display device of the so-called in-plane switching type in which the common electrode opposing with the pixel electrode 301 disposed on the substrate 9 is moved to the substrate 9 such that the resultant electric fields in parallel with the substrate 9 is applied to the liquid crystal molecules and rotate the liquid crystal molecules in a plane in parallel with the substrate 9 as disclosed in Japanese Patent Application Laid-Open No. Hei 6-160878 and U.S. Pat. No. 5,598,285.

The present invention is not limited to liquid crystal display devices, but is also applicable to other display devices employing materials providing electro-optical effects by application of electric fields thereto.

Figure 3A:
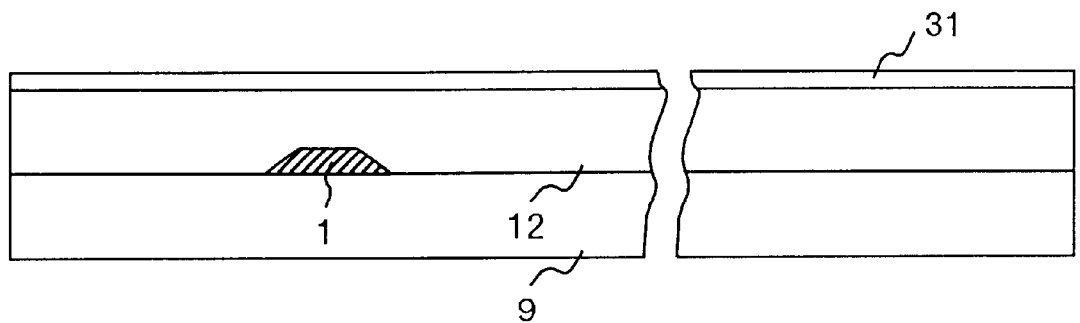
FIGS. 3A to 3C illustrate a production process sequence for fabricating high-voltage and high-performance poly-Si TFTs in the first embodiment of an image display device in accordance with the present invention.
Figure 3B:
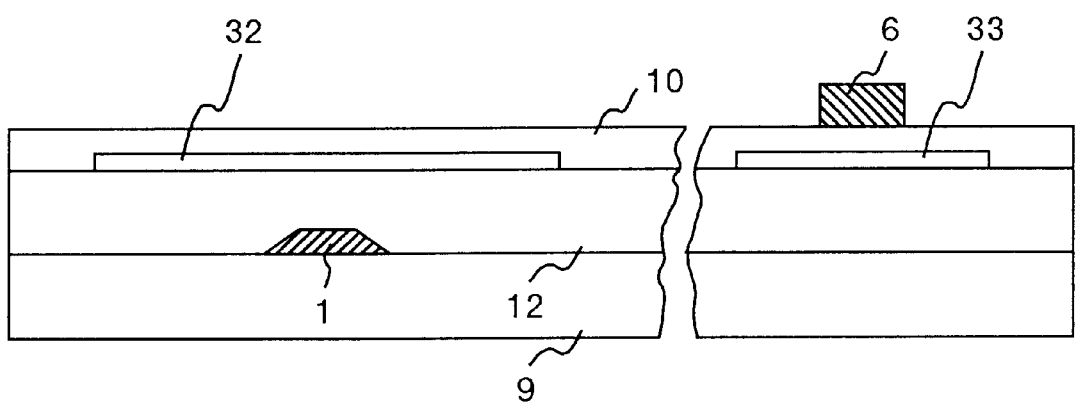
Figure 3C:
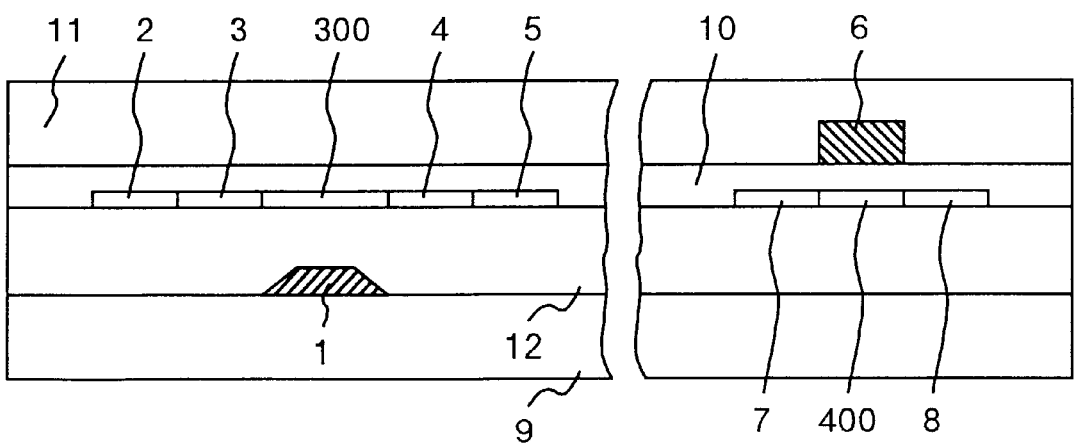

FIGS. 3A to 3C illustrate a production process sequence for fabricating the high-voltage poly-Si TFT 28 and the high-performance poly-Si TFT 328 shown in FIG. 1.

In the stage shown in FIG. 3A, initially the gate 1 for the high-voltage TFT is fabricated on the substrate 9 made of glass or quartz, then the first gate insulating film 12 of $SiO_2$ and about 100 $\mu$m in thickness, for example, is formed on the substrate 9 chemical vapor deposition or the like, and then a poly-Si thin film 31 is formed on the gate insulating film 12. The poly-Si thin film 31 is obtained by depositing an amorphous Si film by chemical vapor deposition or the like and then annealing the amorphous Si film with irradiation of excimer laser or at elevated temperatures of 550° C. to 1200° C. Beveling of the edges of the gate 1 improves coverage properties of the first gate insulating film 12. The gate 1 should be made as thin as possible since the channel region is disposed over the gate 1.

In the stage shown in FIG. 3B, after the channels 32 and 33 are fabricated from the poly-Si thin film 31, the second gate insulating film 10 of $SiO_2$ and 30 μm to 50 μm in thickness, for example, which is thinner than the first gate insulating film 12, is deposited on the first gate insulating film 12 by chemical vapor deposition or the like, and then the gate 6 for the high-performance TFT is fabricated on the second gate insulating film 10. The gate 6 for the high-performance TFT is capable of being made thicker than the gate 1 for the high-voltage TFT, since a channel is not disposed over the gate 6 in the high-performance TFT and consequently there is smaller possibility that a step produced by the gate 6 has any adverse effects.

In the stage shown in FIG. 3C, after an $n^+$ source region 2, an $n^-$ source region 3, an $n^+$ drain region 5, an $n^-$ drain region 4, an $n^+$ source region 7 and an $n^+$ drain region 8 are fabricated by ion implantation, a protective film 11 are formed. The $n^+$ source region 7 and the $n^+$ drain region 8 are fabricated in self-alignment with respect to the gate 6. In FIG. 3C, reference numerals 300 and 400 denote channel regions.

Second Embodiment

A second embodiment of the present invention will be explained by reference to FIGS. 4 and 5.

Figure 5:
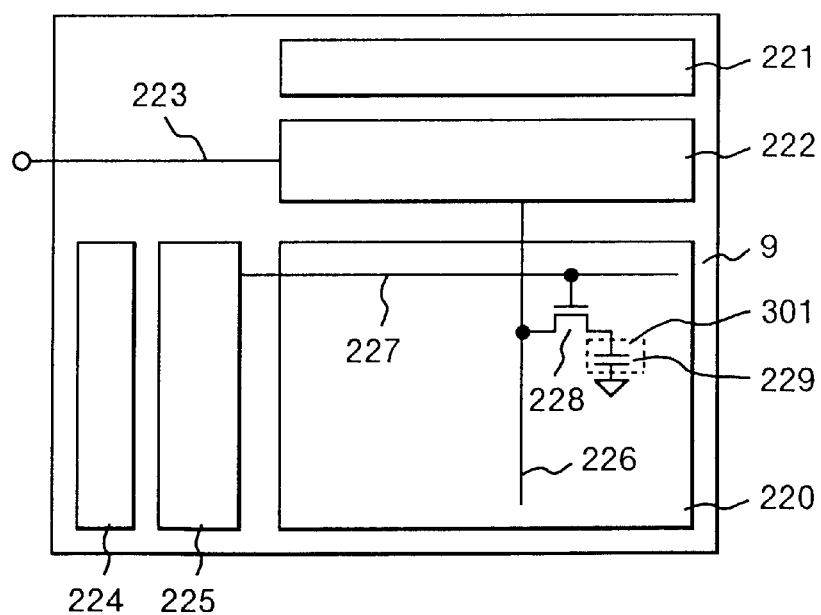
FIG. 5 is an illustration of a structure of a poly-Si TFT liquid crystal display device of the second embodiment of the present invention.
Figure 6:
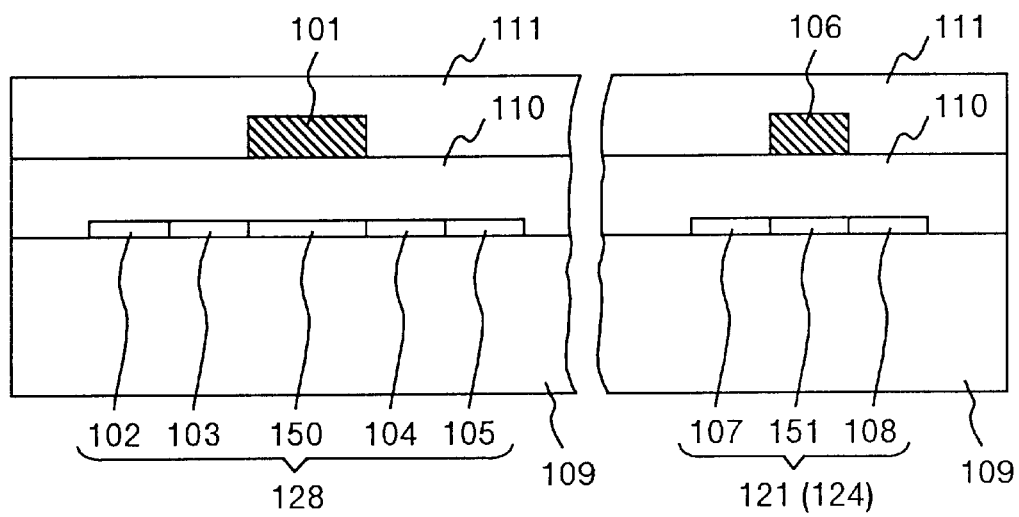
FIG. 6 is a cross-sectional view of a prior art poly-Si TFT.
Figure 7:
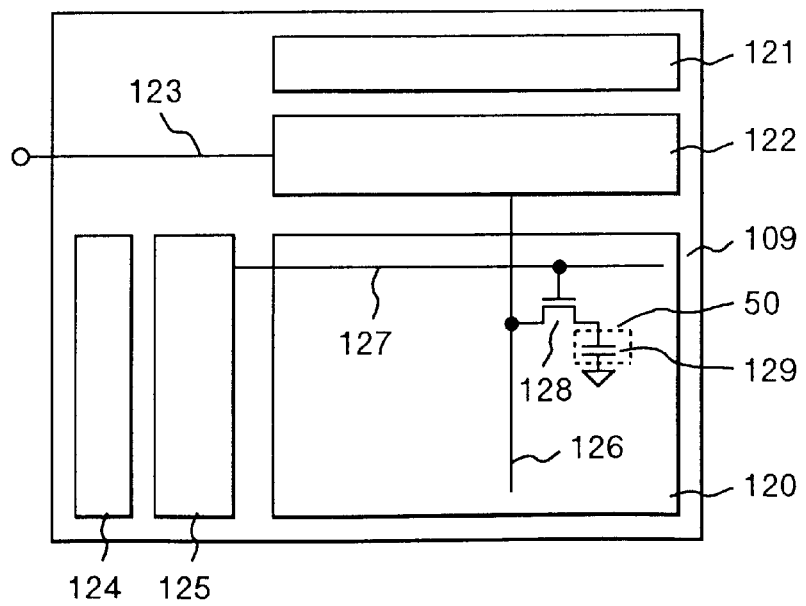
FIG. 7 is an illustration of a structure of a prior art poly-Si TFT liquid crystal display device.

FIG. 5 illustrates a structure of a poly-Si TFT liquid crystal display device of another embodiment in accordance with the present invention. There are a pixel area 220, a signal line shift register 221, a signal line selection switch 222, a gate line shift register 224 and a gate line drive buffer 225 formed on the substrate 9.

A plurality of pixels each comprising a poly-Si TFT 228, a pixel electrode 301 connected thereto and a pixel capacitance 229 formed by the pixel electrode 301 are arranged in a matrix in the pixel area 220, and a gate and a drain of each poly-Si TFT 228 are connected to a gate line 227 and a signal line 226, respectively. For simplicity, only one pixel is shown in FIG. 5.

One end of the gate line 227 is connected to the gate line drive buffer 225 which in turn is scanned by the gate line shift register 224. One end of the signal line 226 is connected to the signal line selection switch 222 which in turn is scanned by the signal line shift register 221. The signal line selection switch 222 is supplied with analog signals via an analog signal input line 223.

The following explains the operation of the second embodiment. The gate line shift register 224 selects the gate lines 227 sequentially via the gate line drive buffer 225. Poly-Si TFTs 228 in pixels in a row corresponding to a selected one of the gate lines 227 are turned on. The signal line shift register 221 scans the signal line selection switch 222 sequentially during this ON period. The signal line selection switch 222 connects the signal lines 226 with the analog signal line input line 223 sequentially as the signal line selection switch 222 is scanned. Accordingly video signals supplied to the analog signal input line 223 are written into the pixel capacitances 229 sequentially via the respective signal lines 226 and the respective poly-Si TFTs 228.

Figure 4:
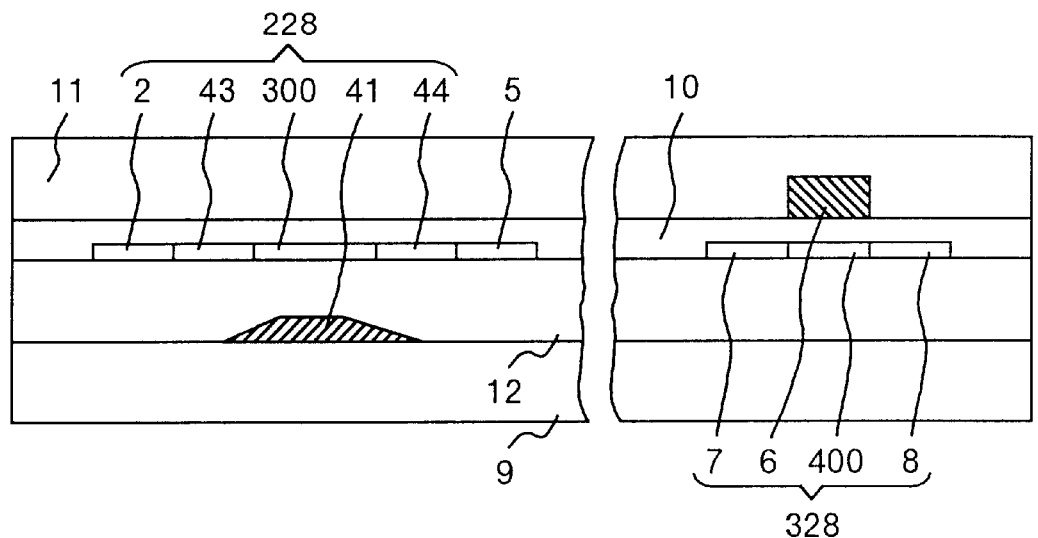
FIG. 4 is across-sectional view of a high-voltage, high-performance poly-Si TFT in a second embodiment of an image display device in accordance with the present invention.

FIG. 4 illustrates a cross-sectional view of an example of a poly-Si TFT 228 representing both the high-voltage poly-Si TFT 228 provided in each pixel and a high-voltage poly-Si TFT constituting the gate line drive buffer 25, and a cross-sectional view of a poly-Si TFT 328 as an example of high-performance poly-Si TFTs constituting the signal line shift register 221, the signal line selection switch 222 and the gate line shift register 224.

Here, for the sake of simplicity, I shall assume n-channel TFTs. The following explanation is applicable to the case where p-channel TFTs are used, except that the poly-Si TFTs 228 and the poly-Si TFTs 328 are of the n-channel type.

The poly-Si TFT 228 disposed in each pixel and the high-voltage poly-Si TFT constituting the gate line drive buffer 225 comprise a gate 41, a channel region 300 formed of a poly-Si thin film, an $n^+$ source region 2, an $n^-$ source region 43, an $n^+$ drain region 5 and an $n^-$ drain region 44 formed on the substrate 9, as in the case of the poly-Si TFT 228 disposed in each pixel illustrated in FIG. 4.

In this embodiment also, as in the case of the first embodiment illustrated in FIG. 1, a pixel electrode 301 (not shown) is connected to the $n^+$ drain region 5 of the poly-Si TFT 228 in each pixel and a common electrode 303 (not shown) is disposed to oppose the pixel electrode 301 with a liquid crystal layer 302 (not shown) interposed therebetween, but the pixel electrode 301, the common electrode 303 and the liquid crystal layer 302 are omitted in FIG. 4.

The poly-Si TFT 328 is an example of the high-performance poly-Si TFTs constituting the signal line shift register 221, the signal line selection switch 222 and the gate line shift register 224, and comprises a gate 6, a channel region 400 formed of a poly-Si thin film, an $n^+$ source region 7 and an $n^+$ drain region 8 disposed on the substrate 9 on which the poly-Si TFTs 228 are formed.

The poly-Si thin film forming the channel region in the high-voltage poly-Si TFT 228 is identical in structure to that in the high-performance poly-Si TFT 328, except for dimensions, but the structure of this embodiment is such that the gate 41 and the first gate insulating film 12 of the high-voltage poly-Si TFT 228 are capable of being optimized independently of the gate 6 and the second gate insulating film 10 of the high-performance poly-Si TFT 328, respectively, as in the case of the first embodiment.

In FIG. 4, the substrate 9 may be made of glass or quartz, the first and second gate insulating films 12, 10 may be formed of $SiO_2$, for example, and the protective film 11 may be formed of $SiO_2$, $Si_3N_4$ or the like. Alignment films for aligning liquid crystal molecules are usually formed on the pixel electrodes 301 (not shown) and the common electrode 303 (not shown) of the liquid crystal display device are omitted from FIG. 4.

A first difference in structure of the TFTs between this embodiment and the first embodiment is that, in this embodiment, the $n^-$ source region 43 and the $n^-$ drain region 44 are overlapped over the gate 41. This structure of overlapping the gate over the source and drain regions provides the high-voltage TFT in this embodiment with higher current drive capability. It is needless to say that the above overlapped structure may be adopted or not depending upon the particular TFTs.

A second difference in structure of the TFTs between this embodiment and the first embodiment is that, in this embodiment, the gate 41 is structured as a light-blocking metal gate. When the TFT liquid crystal display of this embodiment is used for a video projector, if a light source for the video projector is placed above the substrate 9 and the optical system for the video projector is placed below the substrate 9, the light rays which pass through the substrate 9 from the light source, are reflected by the optical system and illuminate the poly-Si TFT 228 from below are blocked by the light-blocking gate 41. The drain lines and the source lines also prevent the light rays from above from entering the poly-Si TFT 228. Incidentally the gate 41 may be made of opaque conductive materials other than metals.

The present invention provides the advantage that the designs of the TFTs used in the peripheral circuits and the pixel area are capable of being optimized independently of each other.

What is claimed is:

1. An image display device comprising:

a plurality of pixels arranged in a matrix, said plurality of pixels each being provided with a pixel switching means, a pixel electrode coupled with said pixel switching means for applying an electric field to a material producing an electro-optical effect;

a common electrode for cooperating with said pixel electrode in driving said material producing an electro-optical effect;

a plurality of gate lines each extending in parallel with each other and connected to a corresponding row of said pixel switching means for selecting said corresponding row of said pixel switching means in a predetermined order;

a gate line driver circuit for driving said plurality of gate lines;

a plurality of signal lines extending in such a manner as to intersect said plurality of gate lines for supplying display signal voltages to said pixel electrodes via selected ones of said pixel switching means; and a display signal voltage applying circuit for applying said display signal voltages to respective ones of said plurality of signal lines, wherein said pixel switching means each is comprised of a poly-Si TFT of a first type structure, said display signal voltage applying circuit contains a plurality of poly-Si TFTs of a second type structure, a gate of each of said poly-Si TFTs of the first type structure is disposed to oppose a first side of a first poly-Si thin film for forming a channel of said poly-Si TFT of the first type structure with a first gate insulating film interposed therebetween and is connected to a corresponding one of said plurality of gate lines, a gate of each of said plurality of poly-Si TFTs of the second type structure is disposed to oppose a first side of a second poly-Si thin film for forming a channel of each of said plurality of poly-Si TFTs of the second type structure with a second gate insulating film interposed therebetween, sources and drains of said poly-Si TFTs of the first and second type structures are disposed approximately in a same plane on a same substrate of said image display device, and said first side of said first poly-Si thin film and said first side of said second poly-Si thin film are on opposite sides of said same plane from each other.

2. An image display device comprising:

a plurality of pixels arranged in a matrix, said plurality of pixels each being provided with a pixel switching means, a pixel electrode coupled with said pixel switching means for applying an electric field to a material producing an electro-optical effect;

a common electrode for cooperating with said pixel electrode in driving said material producing an electro-optical effect;

a plurality of gate lines each extending in parallel with each other and connected to a corresponding row of said pixel switching means for selecting said corresponding row of said pixel switching means in a predetermined order;

a gate line driver circuit for driving said plurality of gate lines;

a plurality of signal lines extending in such a manner as to intersect said plurality of gate lines for supplying display signal voltages to said pixel electrodes via selected ones of said pixel switching means; and a display signal voltage applying circuit for applying said display signal voltages to respective ones of said plurality of signal lines, wherein said pixel switching means each is comprised of a poly-Si TFT of a first type structure, said display signal voltage applying circuit contains a plurality of poly-Si TFTs of a second type structure, a gate of each of said poly-Si TFTs of the first type structure is disposed to oppose a first side of a first poly-Si thin film for forming a channel of said poly-Si TFT of the first type structure with a first gate insulating film interposed therebetween and is connected to a corresponding one of said plurality of gate lines, a gate of each of said plurality of poly-Si TFTs of the second type structure is disposed to oppose a first side of a second poly-Si thin film for forming a channel of each of said plurality of poly-Si TFTs of the second type structure with a second gate insulating film interposed therebetween, sources and drains of said poly-Si TFTs of the first and second type structures are disposed approximately in a same plane on a same substrate of said image display device, said first side of said first poly-Si thin film and said first side of said second poly-Si thin film are on opposite sides of said same plane from each other, and said second gate insulating film is thinner than said first gate insulating film.

3. An image display device according to claim 2, wherein at least one of said drain and said source of each of said poly-Si TFTs of the first type structure is provided with an impurity-doped region extending over a portion of said gate of each of said poly-Si TFTs of the first type structure.

4. An image display device according to claim 2, wherein said gate line driver circuit comprises a gate line selection circuit and a plurality of buffer amplifiers each coupled to a corresponding one of said plurality of gate lines, and said plurality of buffer amplifiers are comprised of said poly-Si TFTs of the first type structure, a remainder of circuits of said gate line driver circuit and said display signal voltage applying circuit are comprised of said poly-Si TFTs of the second type structure.

5. An image display device according to claim 2, wherein said gate of said poly-Si TFT of the first type structure is made of one of metals and optically opaque materials.

6. An image display device according to claim 2, wherein said first side of said first poly-Si thin film is closer to said same substrate than said first side of said second poly-Si thin film is.

7. An image display device according to claim 2, wherein said plurality of poly-Si TFTs of the second type structure contained in said display signal voltage applying circuit form a shift register.

8. An image display device according to claim 2, wherein said material producing an electro-optical effect is liquid crystal.

9. An image display device comprising:

a plurality of pixels arranged in a matrix, said plurality of pixels each being provided with a pixel switching means, a pixel electrode coupled with said pixel switching means for applying an electric field to a material producing an electro-optical effect;

a common electrode for cooperating with said pixel electrode in driving said material producing an electro-optical effect;

a plurality of gate lines each extending in parallel with each other and connected to a corresponding row of said pixel switching means for selecting said corresponding row of said pixel switching means in a predetermined order;

a gate line driver circuit for driving said plurality of gate lines;

a plurality of signal lines extending in such a manner as to intersect said plurality of gate lines for supplying display signal voltages to said pixel electrodes via selected ones of said pixel switching means; and a display signal voltage applying circuit for applying said display signal voltages to respective ones of said plurality of signal lines, wherein said pixel switching means each is comprised of a poly-Si TFT of a first type structure, said display signal voltage applying circuit contains a plurality of poly-Si TFTs of a second type structure, a first gate of each of said poly-Si TFTs of the first type structure is disposed to oppose a first poly-Si thin film for forming a channel of said poly-Si TFT of the first type structure with a first gate insulating film interposed therebetween on a surface of a substrate of said image display device and is connected to a corresponding one of said plurality of gate lines, a second gate of each of said plurality of poly-Si TFTs of the second type structure is disposed to oppose a second poly-Si thin film for forming a channel of each of said plurality of poly-Si TFTs of the second type structure with a second gate insulating film interposed therebetween on said surface, an order of arrangement of said first gate and said first poly-Si thin film is reversed from an order of arrangement of said second gate and second poly-Si thin film, and said second gate insulating film is thinner than said first gate insulating film.

10. An image display device according to claim 9, wherein said first gate is closer to said surface than said first gate insulating film is.

11. An image display device according to claim 9, wherein at least one of said drain and said source of each of said poly-Si TFTs of the first type structure is provided with an impurity-doped region extending over a portion of said gate of each of said poly-Si TFTs of the first type structure.

12. An image display device according to claim 9, wherein said gate line driver circuit comprises a gate line selection circuit and a plurality of buffer amplifiers each coupled to a corresponding one of said plurality of gate lines, and said plurality of buffer amplifiers are comprised of said poly-Si TFTs of the first type structure, a remainder of circuits of said gate line driver circuit and said display signal voltage applying circuit are comprised of said poly-Si TFTs of the second type structure.

13. An image display device according to claim 9, wherein said gate of said poly-Si TFT of the first type structure is made of one of metals and optically opaque materials.

14. An image display device according to claim 9, wherein said plurality of poly-Si TFTs of the second type structure contained in said display signal voltage applying circuit form a shift register.

15. An image display device according to claim 9, wherein said material producing an electro-optical effect is liquid crystal.

\* \* \* \* \*

UNITED STATES PATENT AND TRADEMARK OFFICE
CERTIFICATE OF CORRECTION

PATENT NO. : 6,476,788 B1 Page 1 of 1
DATED : November 5, 2002
INVENTOR(S) : Hajime Akimoto It is certified that error appears in the above-identified patent and that said Letters Patent is hereby corrected as shown below:

Column 1,
Line 58, replace "n"" with -- $n^+$ --

Column 4,
Line 39, replace "mainly, of" with -- mainly of --

Column 5,
Line 32, replace "Poly-Si TFTS" with -- Poly-Si TFTs --

Column 8,
Line 2, replace "buffer 25" with -- buffer 225 --

Signed and Sealed this

Thirteenth Day of July, 2004

JON W. DUDAS
*Acting Director of the United States Patent and Trademark Office*